United States Patent
Chen et al.

(10) Patent No.: US 8,750,053 B2
(45) Date of Patent: Jun. 10, 2014

(54) SRAM MULTIPLEXING APPARATUS

(75) Inventors: Yi-Tzu Chen, Hsin-Chu (TW); Wei-jer Hsieh, Hsin-Chu (TW); Tsai-Hsin Lai, Jhubei (TW); Ling-Fang Hsu, Taipei (TW); Hau-Tai Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 462 days.

(21) Appl. No.: 13/157,163

(22) Filed: Jun. 9, 2011

(65) Prior Publication Data

US 2012/0317374 A1 Dec. 13, 2012

(51) Int. Cl.
*G11C 7/00* (2006.01)
(52) U.S. Cl.
USPC ............ 365/189.02; 365/189.05; 365/230.02
(58) Field of Classification Search
CPC .............................. G11C 7/1006; G11C 7/1051
USPC ..................... 365/189.09, 189.05, 230.02
See application file for complete search history.

(56) References Cited

U.S. PATENT DOCUMENTS

| | | | | |
|---|---|---|---|---|
| 5,673,227 | A * | 9/1997 | Engles et al. | 365/200 |
| 6,240,046 | B1 * | 5/2001 | Proebsting | 365/233.17 |
| 6,292,401 | B1 | 9/2001 | Zhang et al. | |
| 2008/0037333 | A1 * | 2/2008 | Kim et al. | 365/189.02 |
| 2009/0190425 | A1 | 7/2009 | Winograd et al. | |
| 2012/0224408 | A1 * | 9/2012 | Yan et al. | 365/148 |
| 2013/0223140 | A1 * | 8/2013 | Sohn | 365/158 |

* cited by examiner

*Primary Examiner* — Tuan T Nguyen
(74) *Attorney, Agent, or Firm* — Slater and Matsil, L.L.P.

(57) ABSTRACT

An SRAM multiplexing apparatus comprise a plurality of local multiplexers and a global multiplexer. Each local multiplexer is coupled to a memory bank. The global multiplexer has a plurality of inputs, each of which is coupled to a corresponding output of the plurality of local multiplexers. In response to a decoded address in a read operation, an input of a local multiplexer is forwarded to a corresponding input of the global multiplexer. Similarly, the decoded address allows the global multiplexer to forward the input signal to a data out port via a buffer.

14 Claims, 3 Drawing Sheets

SRAM MULTIPLEXING APPARATUS

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them permanently unless non-volatile memories are exposed to an electrical charge. Non-volatile memories include a variety of sub-categories, such as electrically erasable programmable read-only memory (EEPROM) and flash memory.

SRAM cells may comprise different numbers of transistors. According to the total number of transistors in an SRAM cell, the SRAM cell may be referred to as a six-transistor (6-T) SRAM, an eight-transistor (8-T) SRAM, and the like. SRAM cells are arranged in rows and columns. An SRAM cell is selected during either a read operation or a write operation by selecting its row and column. The row and column to be selected are determined by a binary code. For example, a 64 Kb memory chip may comprise a 16-bit binary code controlling the write and read operation. More particularly, the 16-bit binary code is split into two separate 8-bit binary codes for selecting a row and a column respectively. The 64 Kb memory chip may further comprise a row decoder and a column decoder. In response to an 8-bit code, the row decoder is able to generate $2^8$ outputs, which comes to 256 outputs. Likewise, the column decoder is able to generate another $2^8$ outputs. By enabling an output from the row decoder and an output from the column decoder, an SRAM cell can be selected from a memory cell matrix having 256 rows and 256 columns.

In a read operation, the access time of detecting a logic state stored in a memory cell is a key performance index for a memory circuit. The major delay may result from bit line sensing due to the large capacitance resulting from a large number of memory cells coupled to a bit line. In order to reduce delay associated with bit line sensing, modern memory circuits may partition bit lines into two groups, namely local bit lines and global bit lines. As a result, a local bit line may perform a fast read operation because the capacitance of the local bit line is reduced in comparison to that of the bit line in a memory circuit without bit line partitioning.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an SRAM memory circuit comprising a two level multiplexing apparatus. The invention may also be applied, however, to a variety of memory circuits.

Figure 1:
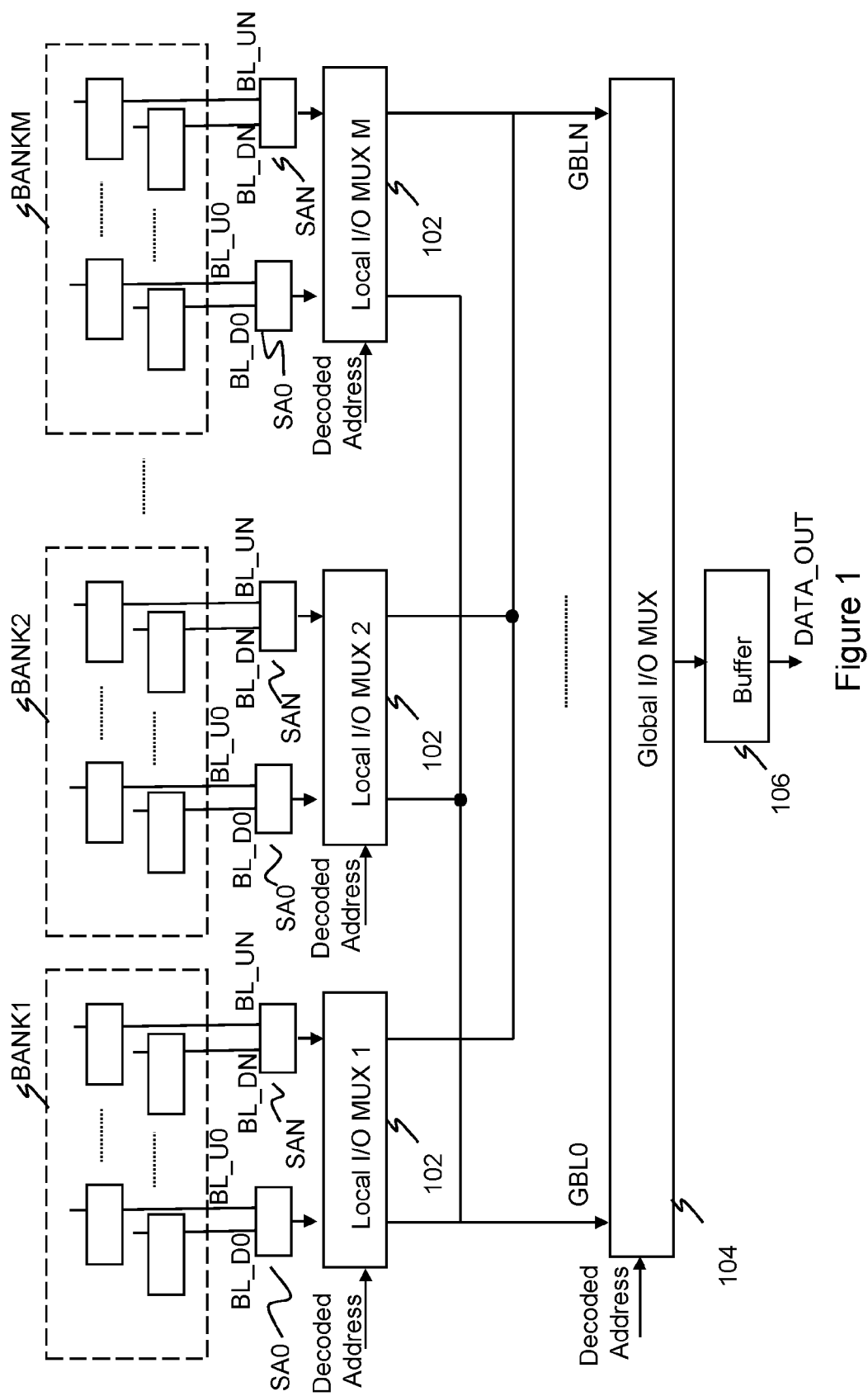
FIG. 1 illustrates a memory circuit comprising a two level multiplexing apparatus in accordance with an embodiment.

Referring initially to FIG. 1, a memory circuit having two level multiplex apparatus is illustrated in accordance with an embodiment. The memory circuit may comprise M memory banks, namely BANK1, BANK2, . . . , BANKM. Each memory bank (e.g., BANK1) may comprise N pairs of local bit lines. An upper bit line (e.g., BL_U0) is coupled to an upper memory cluster, which may comprise a plurality of memory cells connected in parallel. On the other hand, a down bit line (e.g., BL_D0) is coupled to a down memory cluster, which may comprise a plurality of memory cells connected in parallel. As shown in FIG. 1, an upper bit line (e.g., BL_U0) and a down bit line (e.g., BL_D0) are coupled to a sense amplifier (e.g., SA0). For a memory bank having N pairs of local bit lines, N sense amplifiers are employed to receive the data from the memory bank. More particularly, each sense amplifier receives two input signals from a local up bit line and a local down bit line respectively. Furthermore, the sense amplifier performs a NAND operation and generates an output coupled to a corresponding input of the local input/output (I/O) multiplexer 102.

In accordance with an embodiment, a memory bank such as BANK1 may comprise a plurality of memory cells (not shown) arranged in rows and columns. As known in the art, each memory cell may comprise two access switches whose gates are coupled to a word line. Furthermore, in a read or write operation, the memory cells arranged in one row are controlled by a same word line. More particularly, according to the decoded address of a read or write control signal, a word line is set to high when the row of memory cells coupled to the word line will be accessed. The logic high state at the word line turns on each memory cell's access switches of the memory row to which the word line is coupled. As a result, a read or write operation can be performed through the turned on access switches.

The memory cells in a column of the memory bank BANK1 may be vertically connected to a local bit line (e.g., BL_D0). As shown in FIG. 1, in the memory bank BANK1, there may be N local down bit lines and N local upper bit lines. It should be noted that while FIG. 1 shows a single bit line is connected to a column of memory cells, in order to achieve operation, both a bit-line (BL) and the inverse of BL ($\overline{BL}$) are employed to fulfill memory access operations. A local down bit line and a corresponding local upper bit line are coupled to a sense amplifier, which generates an output based upon the data on both the local down bit line and the local upper bit line. The output of the sense amplifier is further coupled to a local I/O multiplexer 102.

The local I/O multiplexer 102 has N inputs, each of which is coupled to a corresponding output of a sense amplifier. In response to a decoded address of a read operation, the local I/O multiplexer 102 may activate an internal logic circuit (not shown but illustrated in FIG. 2) coupled to an input. Because the rest of inputs of the local I/O multiplexer 102 are not activated, the outputs coupled to inactivated inputs keep their previous logic states. Furthermore, the N outputs from the local I/O multiplexer 102 are forwarded to a global I/O multiplexer 104. The detailed operation of the local I/O multiplexer 102 will be described below with respect to FIG. 2. The global I/O multiplexer 104 is coupled between the local I/O multiplexer 102 and a buffer 106. In response to a decoded address, the global I/O multiplexer 104 selects an input from N inputs sent from the M local I/O multiplexers 102. Furthermore, the global I/O multiplexer 104 forwards the selected input to the buffer 106. The buffer 106 may employ a bus keeper (not shown but illustrated in FIG. 2) so that reliable data out can be read at the output of the buffer 106. The detailed operation of the global I/O multiplexer and the buffer 106 will be described below with respect to FIG. 2.

Figure 2:
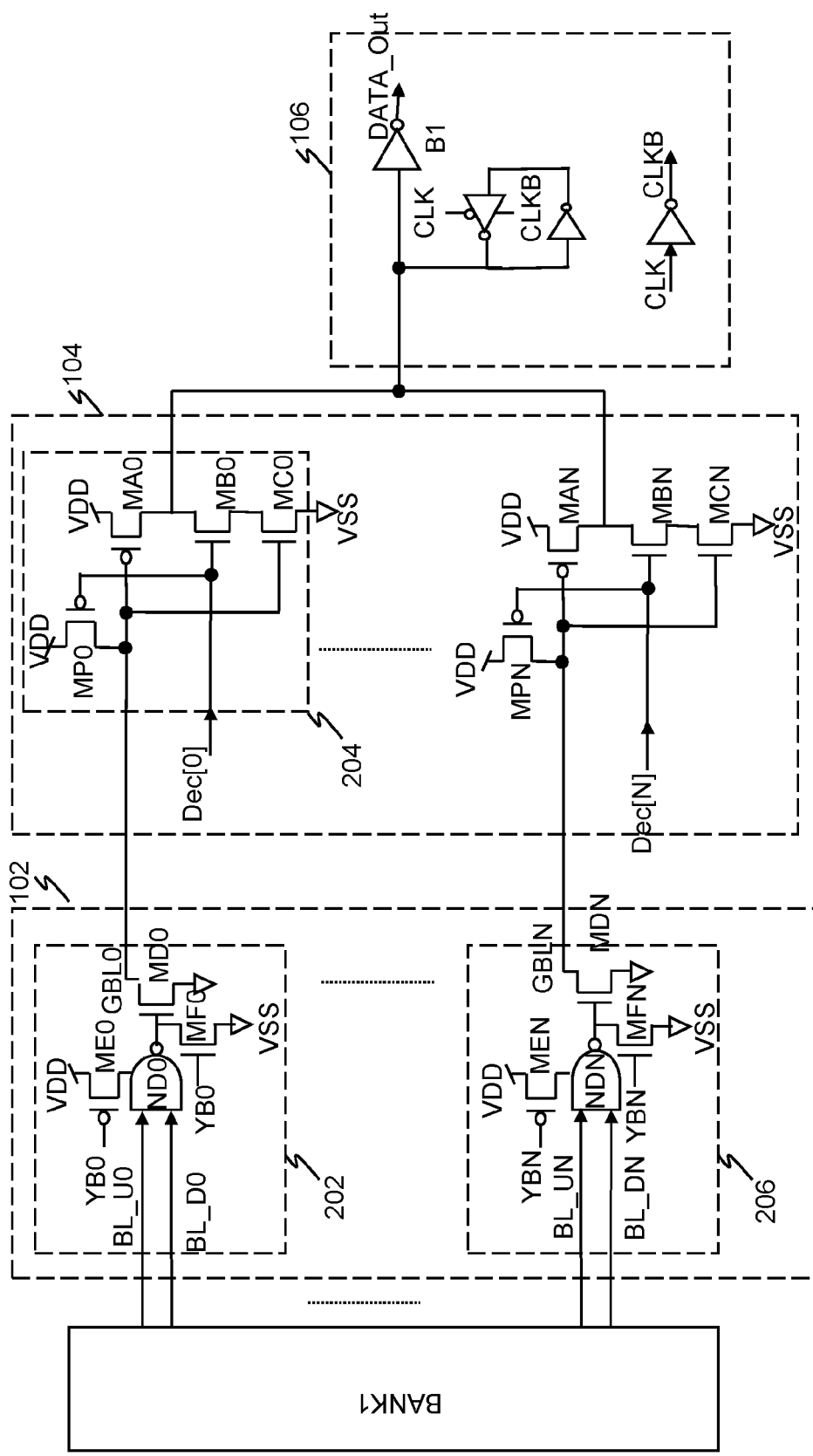
FIG. 2 illustrates in detail the schematic diagrams of the local input/output (I/O) multiplexer, the global I/O multiplexer and the buffer shown in FIG. 1.

FIG. 2 illustrates in detail illustrative schematic diagrams of the local I/O multiplexer 102, the global I/O multiplexer 104 and the buffer 106 shown in FIG. 1. The local I/O multiplexer 102 may comprise a plurality of logic cells (e.g., logic cell 202), each of which is coupled to a local upper bit line and a local down bit line. Furthermore, each logic cell of the local I/O multiplexer 102 may receive a read selection signal decoded by a controller (not shown) from a read address. According to an embodiment, read selection signals from YB0 to YBN are decoded from a read address. During a read operation, only one of the selection signals will be set to low. As a result, only one logic cell is enabled during a read operation and the corresponding data read from a memory cell is forwarded to the corresponding global bit line connected between the local I/O multiplexer 102 and the global I/O multiplexer 104. In order to describe the detailed operation of the local I/O multiplexer 102, a logic cell 202 is used to describe how the local I/O multiplexer 102 performs a multiplexing operation.

The logic cell 202 comprises a negated AND (NAND) gate ND0, a first p-type metal oxide semiconductor (PMOS) transistor ME0, a first n-type metal oxide semiconductor (NMOS) transistor MD0 and a second NMOS transistor MF0. The logic cell 202 receives signals from the memory bank BANK1 via a local upper bit line BL_U0 and a local down bit line BL_D0. In addition, the logic cell 202 receives a control signal YB0 derived from a decoded address. As shown in FIG. 2, the NAND gate ND0 has two inputs coupled to the local upper bit line BL_U0 and the local down bit line BL_D0 respectively. The output of the NAND gate ND0 is coupled to a global bit line GBL0 via the first NMOS transistor MD0. The first NMOS transistor MD0 functions as a buffer to isolate the global bit line GBL0 from the local bit lines.

Both the first PMOS transistor ME0 and the second NMOS transistor MF0 are used to either disable or enable the sense amplifier ND0 so that the logic cell 202 can perform a multiplexing function in response to the control signal YB0. More particularly, when the control signal YB0 is kept high, the first PMOS transistor ME0 is turned off and the second NMOS transistor MF0 is turned on. As a result, the NAND gate ND0 is disconnected from the power supply VDD and the output of the NAND gate ND0 is set to a logic low state. Consequently, the drain of the first NMOS transistor MD0 stays at the previous logic state. On the other hand, when the control signal YB0 is kept low, the first PMOS transistor ME0 is turned on and the second NMOS transistor MF0 is turned off. As a result, both the first PMOS transistor ME0 and the second NMOS transistor MF0 have no impact on the operation of the sense amplifier ND0. The data read from the memory bank BANK1 is forwarded to the global bit line GBL0 via the sense amplifier ND0 and the buffer transistor MD0. In sum, when the control signal YB0 of the logic cell 202 is set to high, the local upper bit line and the local down bit line coupled to the logic cell 202 are not selected. In contrast, when the control signal YB0 of the logic cell 202 is set to low, the local upper bit line and the local down bit line coupled to the logic cell 202 are selected. After a NAND operation through the sense amplifier ND0, the data on the local bit lines is forwarded to the subsequent stage as a global bit line signal.

The schematic diagram of the logic cell 206 (i.e., the Nth logic cell) is the same as that of the logic cell 202, and hence is not discussed herein in order to avoid repetition. As shown in FIG. 2, a plurality of logic cells (e.g., logic cell 202) form the local I/O multiplexer 102. A controller (not shown) decodes a read address and generates corresponding control signals for each logic cell. For a read operation, in response to a read address, only one control signal is set to a logic low state. As a result, only a corresponding logic cell is enabled. Through the enabled logic cell, the data on the local bit line is forwarded to the global bit line connected to the output of the logic cell. An advantageous feature of having a local I/O multiplexer is that only one global bit line may have a logic state transition during a read operation. A single global bit line logic state transition during a read operation may reduce the total power consumption of a memory circuit in comparison with a memory circuit having multiple global bit line logic state transitions during a read operation.

The global I/O multiplexer 104 comprises a plurality of logic circuits, each of which corresponds to a global bit line (e.g., GBL0). A logic circuit 204 is used to describe the operation of the global I/O multiplexer 104. The logic circuit 204 has an input coupled to the global bit line GBL0, an output coupled to the buffer 106 and a control signal input coupled to a control signal Dec[0], which is inverted from the control signal YB0. The logic circuit 204 comprises a first PMOS transistor MAO, a second PMOS transistor MP0, a first NMOS transistor MB0 and a second NMOS transistor MC0. The control signal Dec[0] is used to either disable or enable the logic circuit 204 depending on the logic state of the control signal Dec[0].

During a read operation, when Dec[0] is set to high, the second PMOS transistor MP0 is turned off and the first NMOS transistor MB0 is turned on. As a result, the first PMOS transistor MAO and the second NMOS transistor MC0 form an inverter. Such an inverter allows the global bit line GBL0 to be selected. As a result, the data on the global bit line GBL0 is forwarded to the buffer 106. The global I/O multiplexer 104 comprises a plurality of identical logic circuits. As described above with respect to the local I/O multiplexer 102, during a read operation, only one control signal is set to low in the local I/O multiplexer 102. Thus, only one control signal such as Dec[0] in the global I/O multiplexer 104 is set to high because Dec[0] is the inverse signal of YB0. As such, during a read operation, only one logic circuit of the global I/O multiplexer 104 is enabled.

The logic circuits of the global I/O multiplexer have their outputs connected together. As described above, during a read operation, in response to a decoded address, only one logic circuit in the local I/O multiplexer 102 and the corresponding logic circuit in the global I/O multiplexer 104 are selected. The data at local bit lines coupled to the selected local I/O multiplexer input is forwarded to the buffer 106. The buffer 106 comprises an inverter B1 and a bus keeper. Both the inverter and the bus keeper are known in the art, and hence are not discussed herein.

Figure 3:
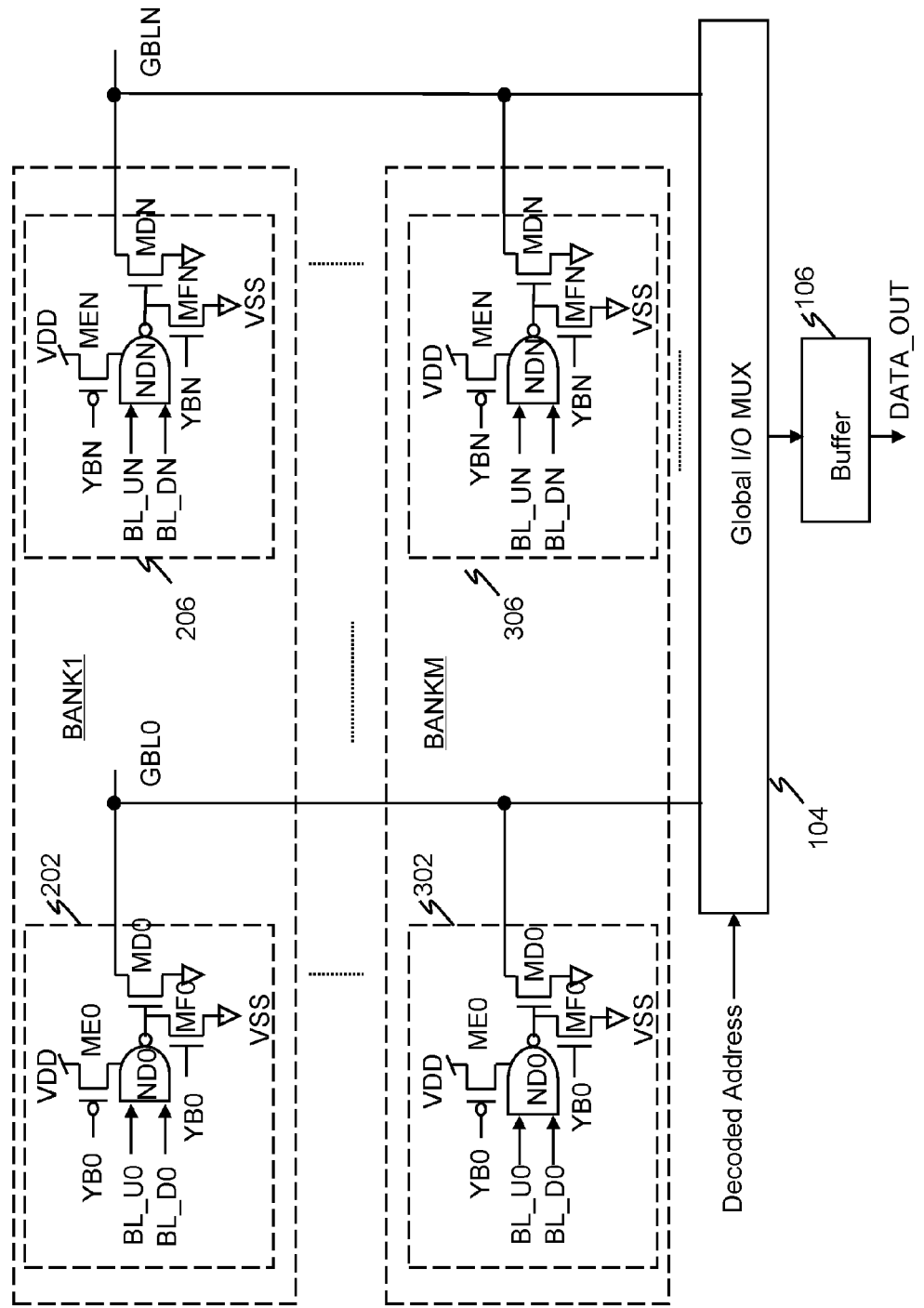
FIG. 3 illustrates a schematic diagram of a two level multiplexing apparatus and a memory circuit formed by a plurality of memory banks.

FIG. 3 illustrates a schematic diagram of a two level multiplexing apparatus and a memory circuit formed by a plurality of memory banks. In according with an embodiment, a memory circuit may comprise M memory banks. As illustrated in FIG. 3, each memory bank may comprise a local I/O multiplexer having N logic circuits 202. Each global bit line is coupled to the corresponding output of the local I/O multiplexer of each memory bank. For example, the global bit line GBL0 is coupled to the logic circuit 202 in the memory bank BANK1 as well as the logic circuit 302 in the memory bank BANKM. Each logic circuit (e.g., logic circuit 202) may comprise an output NMOS transistor (e.g., the first NMOS transistor MD0). As a result, the global bit line GBL0 is coupled to M NMOS transistors. Similarly, the global bit line GBLN is coupled to M NMOS transistors. In consideration of the parasitic capacitance at the output of each NMOS transistor, the total capacitance loading of each global bit line is equal to M times the parasitic capacitance of the NMOS transistor (e.g., MD0). In comparison with some memory circuit having a single global bit line, by employing N global bit lines the capacitance loading of each global bit line is reduced by a factor of N.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a first level multiplexer comprising:
      a plurality of inputs coupled to a plurality of local bit lines;
      a control input coupled to a first control signal derived from a decoded address; and
      a plurality of outputs; and
   a second level multiplexer comprising:
      a plurality of inputs, each of which is coupled to a corresponding output of the first level multiplexer;
      a control input coupled to a second control signal derived from the decoded address; and
      an output coupled to a buffer.

2. The apparatus of claim 1, further comprising:
   a memory bank comprising:
      a first group of memory cells arranged in columns, wherein each column is coupled to a first local bit line;
      a second group of memory cells arranged in columns, wherein each column is coupled to a second local bit line; and
      a sense amplifier having inputs coupled to the first local bit line and the second local bit line.

3. The apparatus of claim 2, wherein the sense amplifier is a NAND gate.

4. The apparatus of claim 2, wherein the first level multiplexer comprises:
   a plurality of logic circuits, each of which comprises:
      a first NMOS transistor having a gate coupled to an output of a corresponding sense amplifier, a source coupled to ground and a drain coupled to a corresponding input of the second level multiplexer;
      a second NMOS transistor having a gate coupled to the first control signal, a source coupled to ground and a drain coupled to the gate of the first NMOS transistor; and
      a first PMOS transistor having a gate coupled to the first control signal, a source coupled to a voltage potential and a drain coupled to the sense amplifier.

5. The apparatus of claim 1, wherein the second level multiplexer comprises:
   a plurality of logic circuits, each of which comprises:
      a second PMOS transistor having a gate coupled to a corresponding output of the first level multiplexer, a source coupled to a voltage potential and a drain coupled to the buffer;
      a third NMOS transistor having a gate coupled to the second control signal and a drain coupled to the drain of the second PMOS transistor;
      a fourth NMOS transistor having a gate coupled to the gate of the second PMOS transistor, a drain coupled to a source of the third NMOS transistor and a source coupled to ground; and
      a third PMOS transistor having a gate coupled to the gate of the third NMOS transistor, a source coupled to the voltage potential and a drain coupled to the gate of the second PMOS transistor.

6. The apparatus of claim 1, wherein the second control signal is inverted from the first control signal.

7. The apparatus of claim 1, wherein the buffer comprises:
   an inverter coupled between the output of the second level multiplexer and a data output port; and
   a bus keeper attached to the output of the second level multiplexer.

8. A system comprising:
   a plurality of first level multiplexers, each of which is coupled to a memory bank, wherein each first level multiplexer receives a first control signal derived from a decoded address;
   a second level multiplexer coupled to the plurality of first level multiplexers, wherein the second level multiplexer receives a second control signal derived from the decoded address; and
   a buffer configured to receive an input from the second level multiplexer and generate an output at a data out port.

9. The system of claim 8, wherein the first level multiplexer comprises a plurality of logic circuits, each of which is coupled to a local bit line, wherein during a read operation one logic circuit is enabled in response to the first control signal.

10. The system of claim 8, wherein the second level multiplexer comprises a plurality of logic circuits, each of which is coupled to a corresponding output of the plurality of first level multiplexers, wherein during a read operation one logic circuit is enabled in response to the second control signal.

11. The system of claim 8, wherein the second control signal is inverted from the first control signal.

12. The system of claim 8, wherein the decode address comprises a binary code, wherein only one bit of the binary code has a logic state transition during a read operation.

13. The system of claim 8, wherein the memory bank comprises:
- a first group of memory cells arranged in columns, wherein each column is coupled to a first local bit line;
- a second group of memory cells arranged in columns, wherein each column is coupled to a second local bit line; and
- a sense amplifier having inputs coupled to the first local bit line and the second local bit line.

14. The system of claim 13, wherein the sense amplifier is a NAND gate.

* * * * *